(12) United States Patent
Allen et al.

(10) Patent No.: US 6,448,568 B1
(45) Date of Patent: Sep. 10, 2002

(54) ELECTRON BEAM COLUMN USING HIGH NUMERICAL APERTURE PHOTOCATHODE SOURCE ILLUMINATION

(75) Inventors: Paul C. Allen; Xiaolan Chen, both of Beaverton; Douglas E. Holmgren; Samuel C. Howells, both of Portland, all of OR (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/365,604

(22) Filed: Jul. 30, 1999

(51) Int. Cl.$^7$ ............................ H01J 40/06; H01J 37/30
(52) U.S. Cl. ................................................. 250/492.24
(58) Field of Search ........................ 250/492.2, 492.24

(56) References Cited

U.S. PATENT DOCUMENTS

| | | | | |
|---|---|---|---|---|
| 3,670,168 A | * | 6/1972 | Low et al. ................... | 250/225 |
| 4,227,090 A | * | 10/1980 | Amboss .................. | 250/492.24 |
| 4,460,831 A | * | 7/1984 | Oettinger et al. ....... | 250/492.24 |
| 4,970,392 A | | 11/1990 | Gettinger et al. ............ | 250/423 |
| 5,023,462 A | * | 6/1991 | Yamada et al. ......... | 250/492.24 |
| 5,121,256 A | | 6/1992 | Corle et al. .................. | 359/664 |
| 6,014,200 A | * | 1/2000 | Sogard et al. ................. | 355/53 |
| 6,054,713 A | * | 4/2000 | Miyake et al. .......... | 250/492.21 |

FOREIGN PATENT DOCUMENTS

| EP | 0 881 542 A1 | 12/1998 |
|---|---|---|
| GB | 2164787 | 3/1986 |

OTHER PUBLICATIONS

Patent Abstracts of Japan, 63073623, Yamada, Apr. 4, 1988.
S.M. Mansfield et al., "High–numerical–aperture lens system for optical storage", Optics Letters, vol. 18, No. 4, Feb. 15, 1993, pp 305–307.
Liqun Han et al., "Analysis Of The Performance Limitations From Coulomb Interaction IN Maskless Parallel Electron Beam Lithography Systems", SPIE vol. 3331, 1998, pp. 292–301.

* cited by examiner

*Primary Examiner*—Bruce Anderson
(74) *Attorney, Agent, or Firm*—Greg H. Leitich

(57) ABSTRACT

A lithography apparatus including both a laser beam source and an electron beam column, where the electron beam column has a support(in one embodiment a window in the column housing) having an index of refraction n. The support, having a photocathode source material disposed on its remote surface, is located in some embodiments such that the internal angle of the incident laser beam is θ with respect to a line perpendicular to the remote surface. The numerical aperture of the substrate(equal to nsin θ) is greater than one in one embodiment, resulting in a high resolution spot size diameter incident on the photocathode source material at the remote surface. Incident energy from the laser beam thereby emits a corresponding high resolution electron beam from the photocathode source material. Electromagnetic lens components are disposed downstream in the electron beam column to demagnify the electron beam. This apparatus allows the continuously decreasing minimum feature dimension sizes for semiconductor electron beam lithography.

18 Claims, 3 Drawing Sheets

ELECTRON BEAM COLUMN USING HIGH NUMERICAL APERTURE PHOTOCATHODE SOURCE ILLUMINATION

FIELD OF THE INVENTION

This invention relates to a hybrid of photolithography and electron beam lithography, and in particular, to an electron beam column using high numerical aperture photocathode source illumination.

BACKGROUND

Lithography is commonly employed to produce repeatable patterns on a semiconductor substrate to form, for example, integrated circuits and flat panel displays. A conventional lithography process begins with coating a substrate with a layer of resist. An image projection system, for example, using an object reticle (i.e., "mask") or sequential scanning (i.e., "direct write"), exposes selected regions of the resist with optical (light) or particle (electron) beams that change the properties of the exposed regions. Using the changed properties, the resist is developed by removing the exposed or unexposed regions (depending on the type of resist) to create a patterned resist mask suitable for further processing such as etching or oxide growth.

Currently, feature sizes of integrated circuits are continuously decreasing, requiring ever finer pattern resolutions. However, the resolution of image projection systems is limited by the spot diameter size (i.e., "spot resolution") of the beams on the target region.

One such conventional technology resulting in small spot diameters is electron beam lithography. An electron beam lithography system accelerates and focuses an intense beam of electrons to direct write precise patterns on the workpiece. However, even more precise patterns are desirable to allow a reduction in feature sizes. Therefore, what is desired is a system and method for forming patterns that have finer resolution than conventional patterns.

SUMMARY

In accordance with the present invention, a hybrid optical/particle beam lithography (imaging) apparatus includes both a laser beam source and an electron beam column. The present electron beam column includes an optically transmissive support having an index of refraction n. The support, having a photocathode source material disposed on its (first) surface opposing the (second) surface on which the laser beam is incident, receives the laser beam such that the internal angle of the marginal rays of the laser beam is θ with respect to a line normal to the support second surface. The numerical aperture (N.A.) of the beam inside the support (equal to nsin θ) is in one embodiment greater than one, resulting in a high resolution spot size diameter incident on the on the photocathode source material. Energy from the laser beam emits a corresponding high resolution electron beam from the photocathode source material. Electromagnetic lens component(s) in one embodiment are disposed in the electron beam column downstream from the photocathode to further demagnify the electron beam.

In one embodiment, the photocathode source material support is an optically transmissive window located at the upper part of the electron beam column. The laser beam passes through the window to impinge on the photocathode source material. In another embodiment, the photocathode source material support is on an optically transmissive substrate which is located inside the electron beam column, spaced apart from the window itself. (The window is necessary because the electron beam must be inside a vacuum, and hence the electron beam is inside a housing, typically of steel. Thus in either case, the photocathode source material is located on a support, either the window or a dedicated support substrate located inside the electron beam column housing.

Since in one embodiment the numerical aperture of the support is greater than one, the spot size diameter of the laser beam incident on the underlying photocathode source is small. A corresponding high resolution electron beam is emitted which then is further demagnified, resulting in electron beam spot sizes (diameters) of high resolutions (e.g., 100 nm or less). Thus the present hybrid of a scanning laser system and an electron beam column allows continuously decreasing minimum dimension sizes for fabrication of semiconductor circuitry.

Another benefit is improving the transmission of the electron optics, which is typically proportional to $(M)^2$ where M is the ratio of spot size at the final image of the electron optics to spot size at the photocathode. A modest value of M allows for smaller incident optical power at the photocathode, leading to improved photocathode lifetimes, and/or system throughputs.

The photocathode source material support in one embodiment is sapphire, which has desirable high thermal conductivity, strength, and transmissivity. However, sapphire is uniaxially birefringent, presenting problems. These problems are overcome by using a particular orientation of the sapphire crystal and polarization of the laser beam, so that the c-axis of the sapphire crystal is oriented in the plane of the support and the polarization of the laser beam is at 90° of the c-axis.

Principles of the present invention will best be understood in light of the following detailed description along with the accompanying drawings.

BRIEF DESCRIPTION OF THE DRAWINGS

Similar reference symbols in the figures represent the same or similar elements.

DETAILED DESCRIPTION

Embodiments of the present invention improve the spot resolution, lifetime, and throughput of electron beam lithography systems. Optical resolution R is defined by the well-known Equation (1).

$$R = k\lambda/N.A. \qquad (1)$$

where
  k is a variable (e.g., 0.8) which depends on system parameters;
  λ is the free space wavelength of the electromagnetic radiation used to form the image; and N.A. is the numerical aperture of the final optical component.

Assuming a given value k, the resolution value R is advantageously reduced by decreasing the free space wavelength λ of the electromagnetic radiation (e.g., a laser beam) and/or by increasing the numerical aperture value (N.A.) of the final optical component (e.g., the substrate or window overlying and supporting the photocathode source material). The present invention is directed to improving resolution by increasing the numerical aperture of that final optical component. "Final" here means the optical element closest to the photocathode source material, called here the support. "Optical element" does not here require refractive power.

Figure 1:
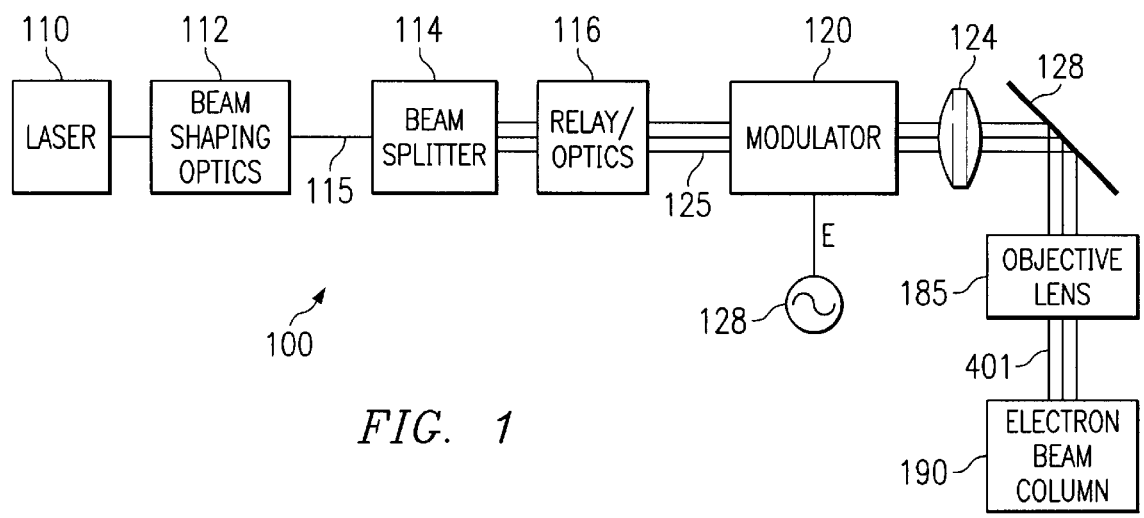
FIG. 1 shows schematically an electron beam lithography system in accordance with the invention.

An electron beam lithography system 100 in accordance with an embodiment of the invention, shown schematically in FIG. 1, includes a conventional laser 110 with beam shaping optics 112, multiple beam splitter 114, relay optics 116, a multi-channel acousto-optical modulator 120, lens 124, mirror 128, objective lens 185 and an electron beam column 190. (Optical elements 110, 112, 114, 116, 120, 128 and 185 are all conventional.) Electron beam column 190 contains a photocathode, shown in FIG. 2.

If conventional materials are used for that photocathode, e.g., gold, a conventional laser 110 with photon energy high enough to overcome the work function is used, such as a frequency doubled Argon ion laser operating at 257 nm (e.g., the Sabre-Fred laser supplied by Coherent). Alternatively, if a cesiated photocathode is used, a conventional laser diode array operating in the red may be substituted for the laser-modulator combination.

Multiple beam splitter 114, relay optics 116, and acousto-optical modulator 120 convert collimated laser beam 115 into a modulated laser beam bundle 125 containing any number (e.g., 8 or 32) of separate collimated laser sub-beams of which, for clarity reasons, only three laser sub-beams are shown in FIG. 1. A suitable laser source is a laser diode, e.g., part no. SDL-7501 from Spectra Diode Laboratories. Proportionally smaller spot size diameters are obtained if light of lower wavelengths is used. Modulator 120 changes the intensities of the individual laser sub-beams typically turning the laser sub-beams on and off in response to an externally provided electrical signal E. Conventional gray scale intensity control can also be employed to provide an optimum irradiance profile to the beam 125 eventually written to the workpiece (not shown). Each laser sub-beam is focused to a separate spot by objective lens 185 on the photocathode substrate in electron beam column 190. The spot array formed on the photocathode is demagnified and scanned by the electron beam column 190.

Electron beam column 190, (shown in detail in one embodiment in FIG. 3 and described below) demagnifies and focuses the electron beams onto the workpiece disposed in a lower portion of electron beam column 190. A conventional x-y stage moves the workpiece perpendicular to the scan line direction of the electron beams. Movement of the workpiece can be continuous during scanning or may only occur each time the associated electron scan optics completes a bundle of electron beam scan lines.

As the electron beams sweep across the corresponding scan line, the corresponding laser sub-beams in laser beam bundle 125 are turned on and off by modulator 120 to control which regions in the corresponding scan line at the surface of the workpiece are illuminated. Thus electron beams sweep a precise image onto the workpiece, the image represented by the signal E externally provided to modulator 120 from source 128.

The final (lowest) surface of the objective lens 185 is preferably in close proximity to the window 401 in the upper part of the electron beam column 190. The window is needed because the electron beam must be in a vacuum, and the window admits the laser beam to the otherwise opaque electron beam column 190 vacuum enclosure. Light is transmitted between the last element of the objective lens 185 and the electron beam column window 401 by, e.g., one of three techniques:

1) An index matching fluid or adhesive;
2) Optically contacting the two surfaces; or
3) Placing the two surfaces within one wavelength of light of each other so that the evanescent wave couples across the gap.

Figure 2A:
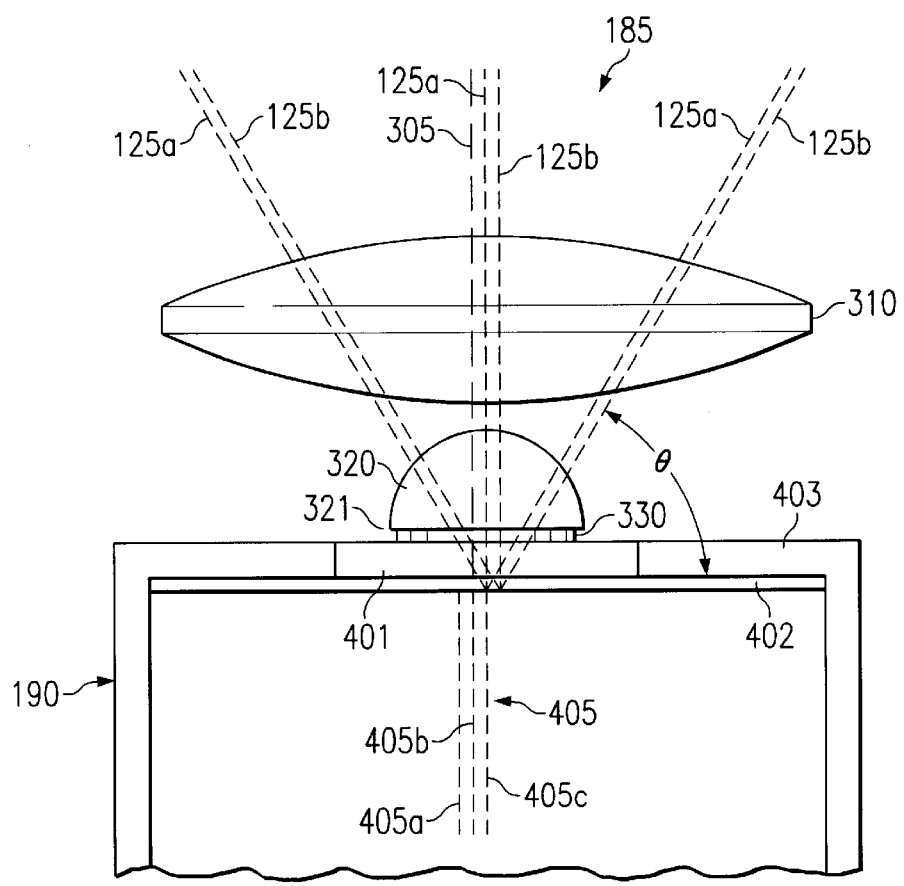
FIG. 2A shows pictorially, in side view, detail of FIG. 1.

FIG. 2A shows in one embodiment the path of two ray bundles 125a and 125b through the lower portion of objective lens 185 and the electron beam column window 401 in a cross-sectional view. Objective lens 185 includes in this example positive (focusing) lens element 310 and hemispherical lens element 320. (Lens 185 would generally conventionally include other optical components, now shown.) Lens element 320 is the final optical element here at the objective lens 185. The marginal rays enter the window 401 at a relatively oblique angle for small spots. Lens elements 310, 320 are only exemplary; hemispherical lens 320 allows use of an index matching fluid or a narrow air gap 330. The upper part of the optically opaque transmissive housing of electron beam column 190 is shown at 403.

The laser sub-beams 125a, 125b pass from within index matching fluid or narrow gap 330 and through the optically transmissive window 401. Optically transmissive window 401 and lens 320 are, for example, sapphire, diamond, fused silica, calcium fluoride, or optical glass. Thus laser sub-beams 125a, 125b are each incident on photocathode source layer 402 formed on the underside of window 401 and eject corresponding electron beams 405a, 405b and 405c from photocathode source layer 402 into the vacuum within electron beam column 190. Photocathode source layer 402 is, e.g., a thin layer of gold, cesiated gallium arsenide, or cesiated semiconductor film conventionally formed, in this embodiment, on the remote (lower) surface of window 401. The advantage of cesiated semiconductor films is that the work function for ejecting electrons is relatively low such that even red light may eject electrons from the film. Examples of a suitable electron beam column are commercial electron beam columns within electron beam lithographic equipment such as the Mebes 5000 supplied by Etec Systems, Inc.

Figure 2B:
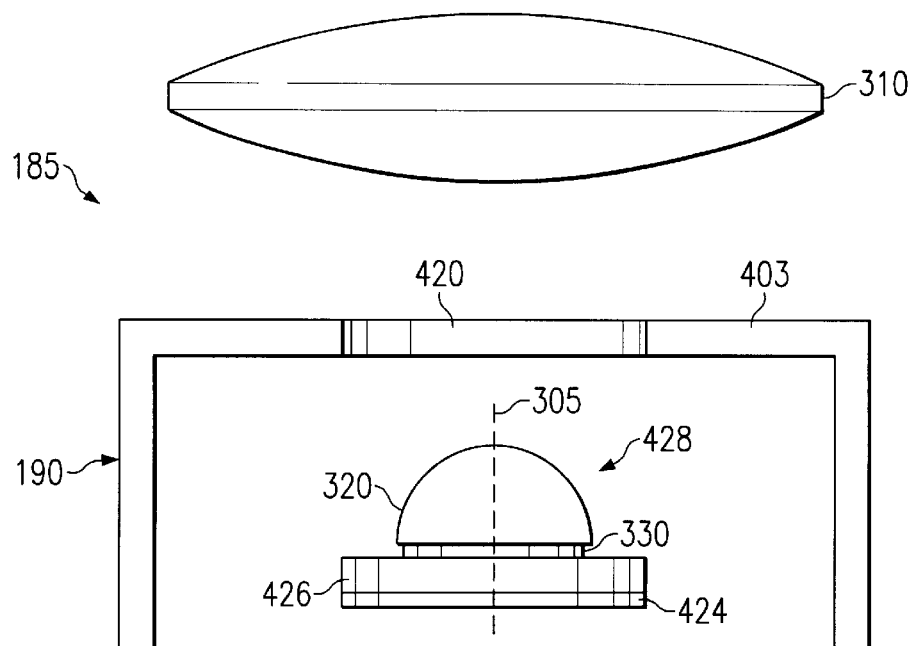
FIG. 2B shows pictorially another embodiment of detail of FIG. 1.

FIG. 2B shows in some respects a structure similar to that of FIG. 2A, except that the photocathode is not located on the surface of the window 420. Instead, the photocathode source layer 424 is formed on a transparent substrate 426 support which plays the role of window 401 in FIG. 2A of supporting the photocathode source layer. Lens element 310 focuses the laser beams passing through window 420 onto hemispherical lens 320. In this arrangement there is a narrow vacuum gap or a layer of nonvolatile index matching material 330 between lens 320 and support 426. The laser beams and electron beams are not shown in FIG. 2B. Also, in both FIGS. 2A and 2B, the conventional mounting structures for the various lenses and structures 424, 426 are not shown.

The numerical aperture (N.A.) of the beams in the window 401 (or the photocathode substrate 426 in FIG. 2B) is in some embodiments very high (e.g., greater than 1). The effective numerical aperture is defined by the well-known Equation (2).

$$N.A. = n \sin \theta \quad (2)$$

where
- n is the index of refraction of the support material; and
- θ is the angle of laser beam bundle 125 with respect to the optical axis 305 where laser beam bundle 125 is incident on photocathode source material 402.

The index of refraction n of the window (or photocathode substrate) is in some embodiments relatively high (e.g., approximately 1.80 for SF6 glass) and the angle θ of laser beam bundle 125 within the window (or substrate) with respect to the optical axis 305 is relatively obtuse (e.g., θ=64 degrees). Therefore in some embodiments the effective numerical aperture of the window (or substrate) is above one (approximately 1.62 if θ is 64 degrees and the index of refraction of lens component 320 is 1.80).

A focusing objective of numerical aperture NA illuminated by a laser beam truncated at the $1/e^2$ intensity point will produce a theoretical spot size d=0.57 λ/NA where d is the full width, half maximum diameter. Thus the laser beam spot size diameter on the photocathode source material could be made as small as 223 nm full width half maximum ("FWHM") if the free space operating wavelength λ of the laser beam is 635 nanometers.

Figure 3:
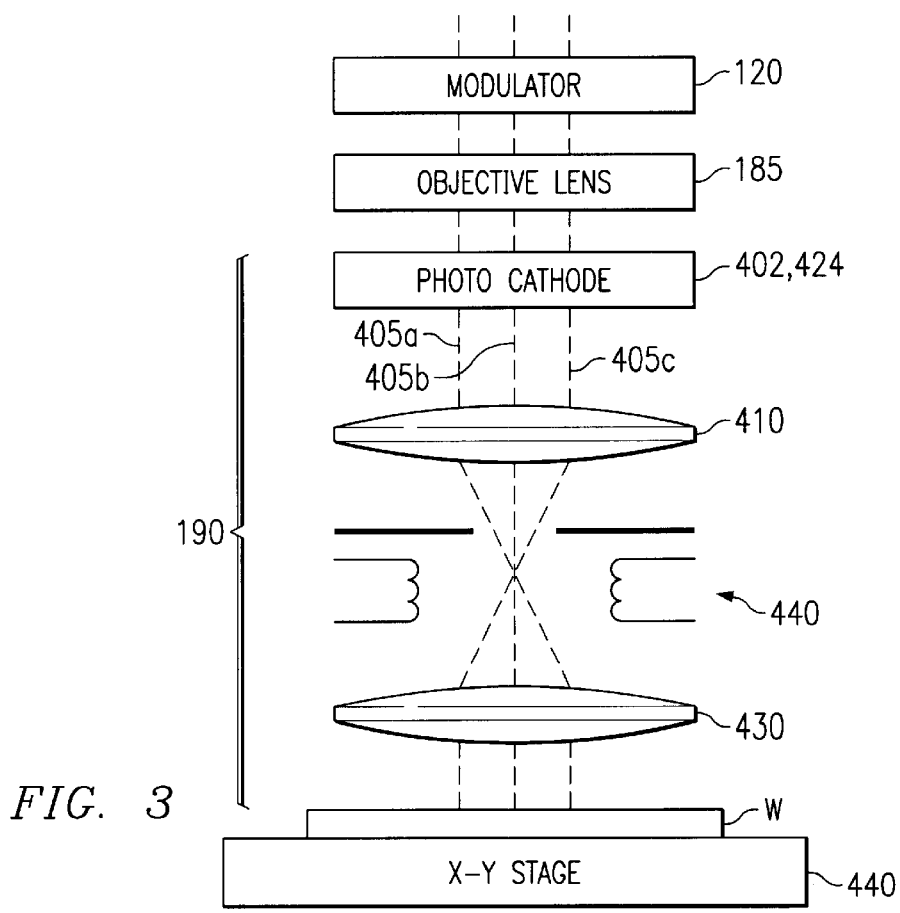
FIG. 3 shows detail of the electron beam column of the system of FIG. 1.

FIG. 3 shows relevant portions of the optical portion of the FIG. 1 system and the electron beam column 190 in more detail. FIG. 3 is generic to the FIGS. 2A, 2B embodiments. (The substrate/window is not shown supporting photocathode source material 402, 404.) In FIG. 3, electron beam bundle 405a, 405b, 405c is further demagnified in electron beam column 190 to reduce the spot size diameter. Each electron beam 405a, 405b and 405c is demagnified by electromagnetic lenses 410 and 430, deflected by deflection system 440, and is incident onto a workpiece W (e.g., a semiconductor wafer or mask blank). Workpiece W is conventionally located on movable x-y stage 440 (referred to above) which moves continuously, or in a stepped fashion, perpendicular to the scan direction (determined by deflection system 440) such that the electron beam bundle 405 conventionally is raster scanned onto workpiece W.

In accordance with yet another embodiment of the invention, a particular material is used for the photocathode support. In one embodiment this is sapphire material used due to its high thermal conductivity, mechanical strength, and transmission over a broad wavelength region, including down to the ultraviolet. However, sapphire is a material of a class which is referred to as "birefringent", generally refracting light of different polarizations at different angles. This makes it somewhat difficult to form a high numerical aperture, small spot inside or through such material.

In accordance with the invention it has been determined that sapphire or other birefringent materials may be used for the photocathode support, so long as they have a particular orientation of the sapphire material or other material and the polarization of the incident laser beam is required to make tightly focused spots. Sapphire is an example of a uniaxial crystal, in that it has one direction the c-axis, which behaves differently than all other axes. The material is rotationally symmetric about this axis. The best imaging properties are obtained by orienting the c-axis in the plane of the window (support) material and the polarization of the laser beam oriented 90° to the c-axis.

Such a structure may be used in any application that a small spot is created in or through the photocathode support material. There is no requirement for a last focusing element in close proximity, such as the above-described optically contacted, indexed matched, or evanescently coupled situations.

Figure 4A:
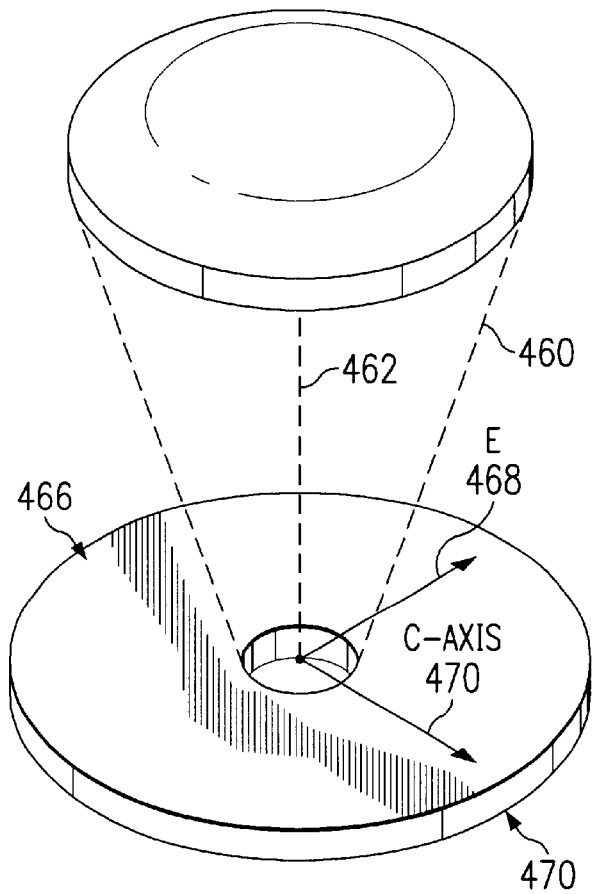
FIG. 4A shows pictorially another embodiment with a birefringent material support.

FIG. 4A shows generally use of a birefringent photocathode support material as disclosed above. In this case the linearly polarized laser beam 460, having central axis 462, is incident upon a sapphire (or other birefringent material) photocathode support 466. The arrow E marked 468 is the orientation of the laser beam electric field The c-axis of the crystalline sapphire support is shown at 470. Of course this orientation of the laser beam electric field and the c-axis shown by the arrows are not actual structures, but vectors. The actual photoemissive material 470 is shown on the underlying surface of support 466. This shows the preferred orientation for a uniaxial birefringent material used as a photocathode support.

Figure 4B:
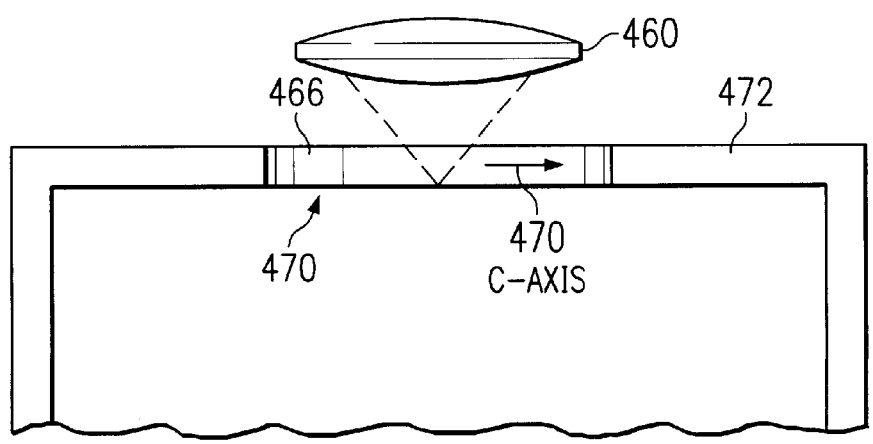
FIG. 4B shows use of the FIG. 4A structure in an electron beam column.

Use of this in an electron beam column is illustrated in a side view in FIG. 4B, with similar elements having the same reference numbers as in FIG. 4A. Additionally, there is depicted the electron beam column housing 472, in which the birefringent support material 466 is a window in this embodiment. Similar to the embodiment of FIG. 2A, the photocathode source material 470 is shown formed on the underside of window 466. However, unlike the situation in FIG. 2A, there is no final focusing element such as lens 320 needed in close proximity to window 466.

Although principles of the present invention have been described with respect to specific embodiments, these embodiments are illustrative only and not limiting. In light of this disclosure, it will be apparent to those skilled in the art that various modifications may be made in accordance with the principles of the present invention. The scope of the present invention is defined by the following claims.

We claim:

1. An apparatus comprising:
   a source of a laser beam; and
   an electron beam column comprising:
      a photocathode support of a material transmissive to the laser beam; and
      a photocathode source material disposed on a remote surface of the support, wherein the photocathode source material and the support are located with respect to the source of the laser beam so that the laser beam radiates through the support at an angle with respect to a line perpendicular to a plane defined by the remote surface, thereby emitting an electron beam;
      wherein said photocathode support maintains said photocathode source material in close proximity to an objective lens for focusing said laser beam.

2. The apparatus of claim 1, further comprising:
   an electron lens component located with respect to the photocathode source material to demagnify the electron beam.

3. The apparatus of claim 1, wherein the laser beam is a stationary laser beam.

4. The apparatus of claim 3 further comprising an optical element located to scan the laser beam.

5. The apparatus of claim 1, further comprising:
   an immersion lens located on an optical path between the source of the laser beam and the support, thereby to direct the laser beam to the support.

6. The apparatus of claim 5, further comprising;
   a fluid disposed between the immersion lens and the support.

7. The apparatus of claim 5, wherein the immersion lens is of a material chosen from the group consisting of fused silica, calcium fluoride, sapphire, diamond and optical glass.

8. The apparatus of claim 1, wherein the support is of a material chosen from the group consisting of fused silica, calcium fluoride, sapphire, diamond and optical glass.

9. The apparatus of claim 1, wherein:

the source of the laser beam outputs a plurality of scanned laser beams;

the material of the support is transmissive to the plurality of scanned laser beams;

the photocathode source material and the support are located so that the plurality of scanned laser beams radiates through the support at the angle with respect to the line perpendicular to the plane defined by the remote surface; and the plurality of scanned laser beams is incident on the photocathode source material at the remote surface, thereby emitting a corresponding plurality of scanned electron beams.

10. The apparatus of claim 1, wherein the support is a window disposed in a housing of the electron beam column.

11. The apparatus of claim 1, further comprising:

a window disposed in a housing of the electron beam column, the window being optically transmissive of the laser beam; and wherein the support is spaced apart from the window.

12. The apparatus of claim 1, wherein an index of refraction of the support is n, the angle is $\theta$, and $n\sin\theta$ is greater than one.

13. An apparatus comprising:

a source of a laser beam; and an electron beam column comprising:

a photocathode support of a material transmissive to the laser beam; and a photocathode source material disposed on a remote surface of the support, wherein the photocathode source material and the support are located with respect to the source of the laser beam so that the laser beam radiates through the support at an angle with respect to a line perpendicular to a plane defined by the remote surface, thereby emitting an electron beam;

wherein the support is of a uniaxially birefringent crystalline material, having a c-axis about which it is rotationally symmetric, and wherein the c-axis extends in a plane parallel to that defined by a principal surface of the photocathode source material, and a polarization direction of the laser beam is at 90° to the c-axis.

14. The apparatus of claim 13, wherein the support material is sapphire.

15. A method comprising:

directing a laser beam onto a surface of a support in an electron beam column such that an axis of the laser beam is at an angle with respect to a line perpendicular to a plane defined by an opposing surface of the support; and directing the laser beam onto a photosensitive material located at the opposing surface of the support, whereby an electron beam is emitted from the photosensitive material in response to the incident laser beam;

wherein said support maintains said photocathode source in close proximity to an objective lens for focusing said laser beam.

16. The method of claim 15, wherein the directing the laser beam onto the support comprises directing a plurality of scanned laser beams.

17. A method comprising:

directing a laser beam onto a surface of a support in an electron beam column such that an axis of the laser beam is at an angle with respect to a line perpendicular to a plane defined by an opposing surface of the support; and directing the laser beam onto a photosensitive material located at the opposing surface of the support, whereby an electron beam is emitted from the photosensitive material in response to the incident laser beam;

wherein the support is of a uniaxially birefringent crystalline material, having a c-axis about it is rotationally symmetric, and wherein the c-axis extends in a plane parallel to that defined by a principal surface of the photocathode source material, and further comprising the act of arranging the laser beam so that its polarization direction is at 90° to the c-axis.

18. A method of operating a photocathode, comprising:

directing an incident laser beam onto a support on which a photocathode material lies, wherein the support is an axially birefringent crystalline material having a c-axis about which it is rotationally symmetric;

orienting the support so that its c-axis extends in a plane parallel to that defined by a principal surface of the photocathode material; and orienting the incident laser beam so that its polarization direction is at 90° to the c-axis;

wherein said support maintains said photocathode source in close proximity to an objective lens for focusing said laser beam.

* * * * *